(12) United States Patent
Cheng

(10) Patent No.: US 6,420,009 B1
(45) Date of Patent: Jul. 16, 2002

(54) RESILIENT SHEET OF CONNECT PORT FOR ISOLATING ELECTROMAGNETIC WAVES

(75) Inventor: Ying-Yie Cheng, Taipei Hsien (TW)

(73) Assignee: Mace Tech Corp., Taoyuan (TW)

( * ) Notice: Subject to any disclaimer, the term of this patent is extended or adjusted under 35 U.S.C. 154(b) by 49 days.

(21) Appl. No.: 09/737,573

(22) Filed: Dec. 18, 2000

(51) Int. Cl.[7] .................................................. B32B 3/06
(52) U.S. Cl. ........................ 428/99; 428/120; 428/122; 361/818
(58) Field of Search ........................ 428/99, 122, 120; 361/818, 800; 174/35 MS, 35 GC

(56) References Cited

U.S. PATENT DOCUMENTS 6,278,617 B1 * 8/2001 Yang et al. .................. 361/818

* cited by examiner

Primary Examiner—Alexander S. Thomas
(74) Attorney, Agent, or Firm—Rosenberg, Klein & Lee

(57) ABSTRACT

The present invention proposes a resilient sheet of connect port for isolating EM waves, which sheet comprises a main body of rectangular sheet and an outer frame bent toward the same direction from the edge of the main body. The cross section of the outer frame is U-shaped, and a plurality of bumps equally spaced are formed on the outer side surface thereof. A plurality of resilient plates and resilient projective ears slanting forwards are formed on the edge of the outer frame. A raised point is formed on each of the resilient projective ears. The raised points will contact a rear plate set of the case of a computer. The resilient projective ears will be bent backwards due to the push of the rear plate set.

3 Claims, 6 Drawing Sheets

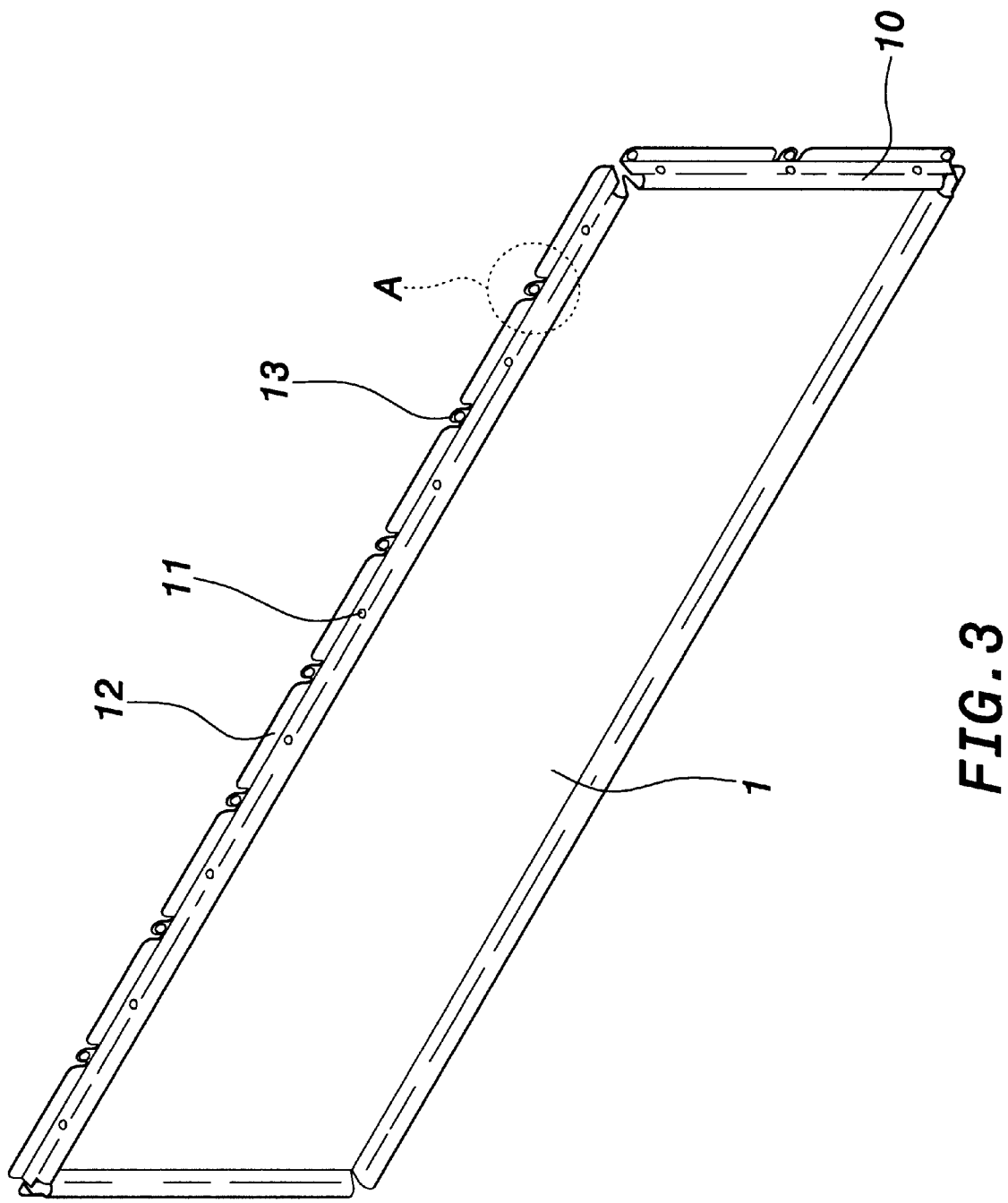

RESILIENT SHEET OF CONNECT PORT FOR ISOLATING ELECTROMAGNETIC WAVES

FIELD OF THE INVENTION

The present invention relates to a resilient sheet of connect port for isolating electromagnetic waves and, more particularly, to a resilient sheet of connect port, which is retained on a rear window of the case of a computer through a plurality of bumps and contacts a rear plate set of the case of the computer through a plurality of raised points of resilient projective ears. Thereby, the count of contact points of the resilient sheet with the rear plate set can be increased so that electromagnetic (EM) waves will not leak easily.

BACKGROUND OF THE INVENTION

For general electronic products, when the internal electronic components thereof operate, EM waves will be generated and emitted out because of EM oscillation. The EM waves have negative influences on the human body. Moreover, due to rapid development of electronics and information industries, computers have been widely used. Computers of fast speed cause larger influences because of higher frequency. Therefore, when designing and manufacturing computers, the problem of preventing EM waves must be carefully considered so as to reduce the extent of leakage of EM waves to minimum.

As shown in FIGS. 1 and 2, a prior art resilient sheet of connect port comprises a main body 1a of rectangular sheet and an outer frame 10a, which is bent toward the same direction from four edges of the main body 1a. The cross section of the outer frame 10a is U-shaped, and a plurality of bumps 11a equally spaced are formed on the outer side surface thereof. The resilient sheet of connect port is retained on a rear window of the case of a computer through the bumps 11a. A resilient plate 12a then contacts a rear plate set 2a.

However, because both the rear plate set 2a and the resilient plate 12a of the resilient sheet of connect port are metal plates, they can not made completely flat in the fabrication process, and they will easily deform due to external forces so that they cannot stick each other tightly, as shown in FIG. 2A. Moreover, because there are very few contact points, many gaps will be formed so that the effect of isolating EM waves cannot be obtained. The present invention aims to resolve the above problems in prior art.

SUMMARY OF THE INVENTION

The primary object of the present invention is to provide a resilient sheet of connect port for isolating EM waves. A plurality of resilient projective ears are formed on the edges of an outer frame of the resilient sheet. Raised points are formed on the resilient projective ears. The count of contact points of the resilient sheet with a rear plate set of the case of a computer is increased through the contact of the raised points with the rear plate set so that the extent of leakage of EM waves can be reduced.

The various objects and advantages of the present invention will be more readily understood from the following detailed description when read in conjunction with the appended drawings, in which:

BRIEF DESCRIPTION OF THE DRAWINGS

FIG. 3 is a perspective view of the present invention;

DETAILED DESCRIPTION OF THE PREFERRED EMBODIMENTS

Figure 1:
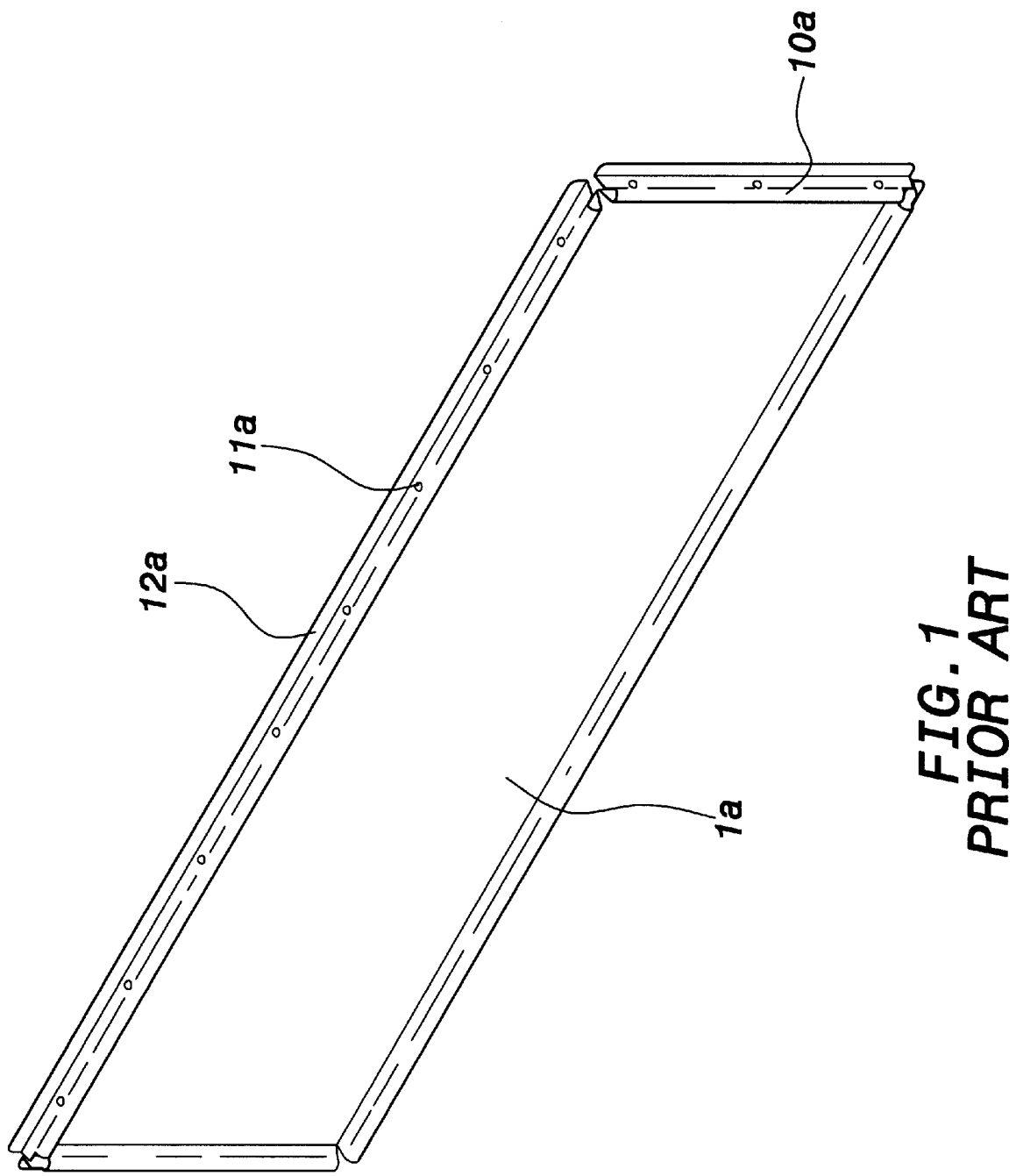
FIG. 1 is a perspective view of a prior art resilient sheet of a connect port.
Figure 2A:
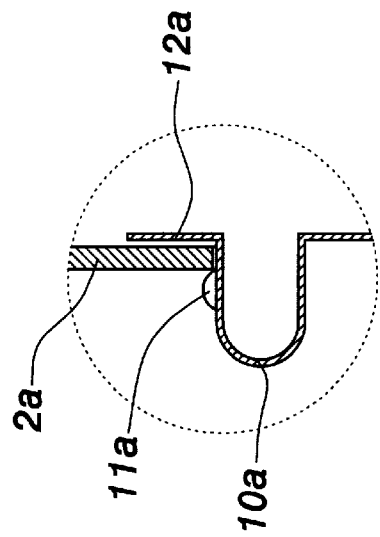
FIG. 2A is an enlarged view of part A shown in FIG. 2.
Figure 2:
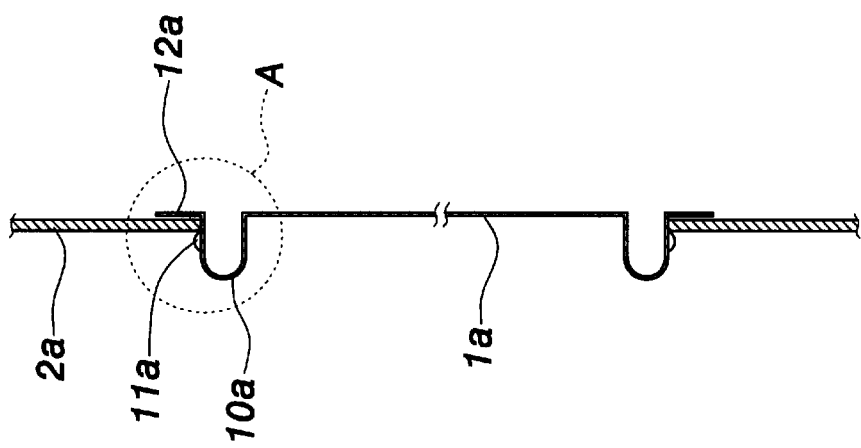
FIG. 2 is a side cross-sectional view of a prior art resilient sheet of a connect port.
Figure 3A:
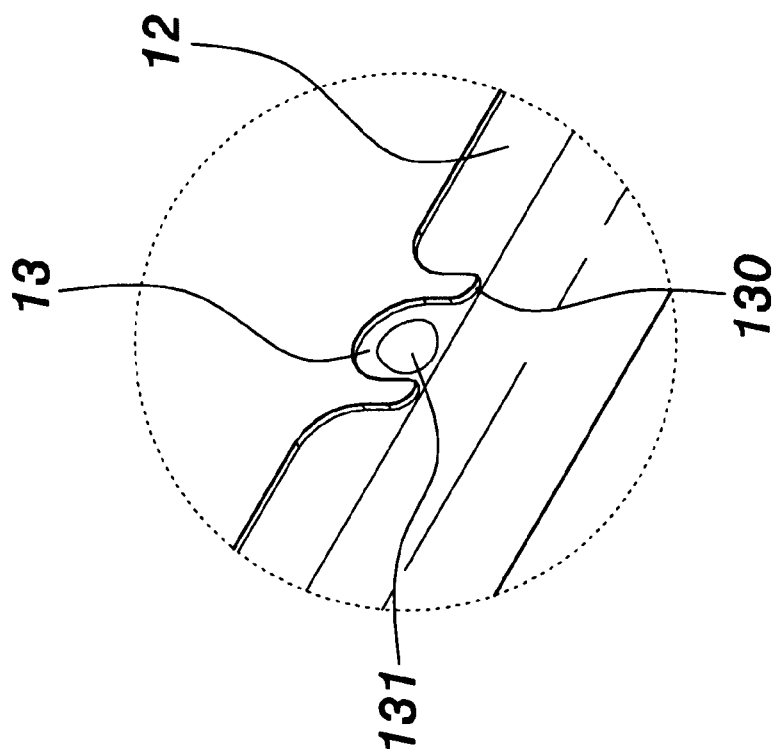
FIG. 3A is an enlarged view of part A shown in FIG. 3.
Figure 4A:
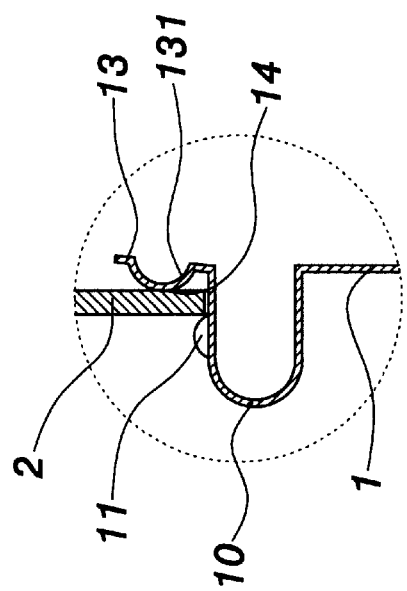
FIG. 4A is an enlarged view of part A shown in FIG. 4.
Figure 4:
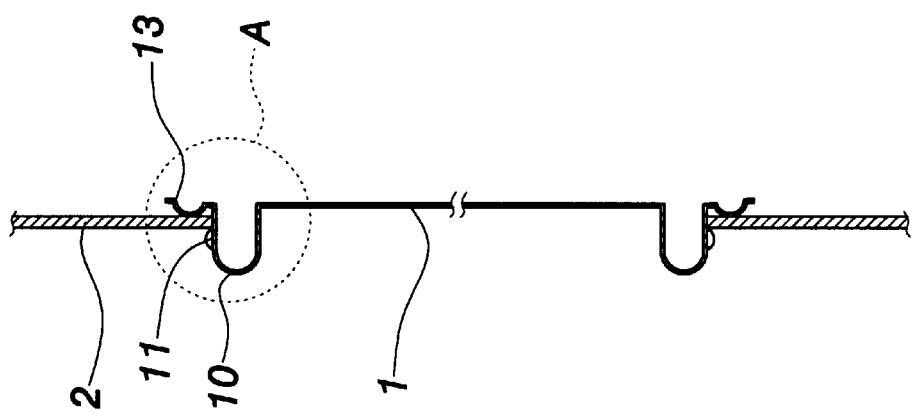
FIG. 4 is a side cross-sectional view of the present invention.

As shown in FIGS. 3 and 4, the present invention provides a resilient sheet of connect port for isolating EM waves, which sheet is retained on a rear window 20 of the case of a computer. The resilient sheet of connect port comprises a main body 1 of rectangular sheet and an outer frame 10, which is bent toward the same direction from four edges of the main body 1. The cross section of the outer frame 10 is U-shaped, and a plurality of bumps 11 equally spaced are formed on the outer side surface thereof. A plurality of resilient plates 12 and resilient projective ears 13 slanting forwards are formed on the edge of the outer frame 10, as shown in FIG. 3A. Each resilient projective ear 13 is situated between two adjacent resilient plates 12. A gap 130 is formed between the resilient plate 12 and the resilient projective ear 13. The reason is that when two contact sides contact each other, more contact points can be obtained if one contact side is divided into several sections so that gap in between can be reduced. A raised point 131 is formed on each of the resilient projective ear 13. The raised points 131 contact tightly on a rear plate set 2 so as to increase the count of contact points 14 of the resilient sheet of connect port with the rear plate set 2, as shown in FIG. 4A.

Because raised points 131 are formed on the plurality of resilient projective ears 13 at the outer edge of the resilient sheet of connect port for isolating EM waves of the present invention, the raised points 131 will contact the rear plate set 2 of the case of the computer. The resilient projective ears 13 will be bent backwards due to the push of the rear plate set 2. Because the resilient plates 12 are separated from the resilient projective ears 13 by gaps 130, they will not be bent backwards. The resilient plates 12 can contact the rear plate set 2 so that tight contact can be achieved between the edge of the resilient sheet of connect port and the rear plate set 2. Therefore, the present invention can have more contact points 14 than a prior art resilient sheet of connect port can. Moreover, much gap can be reduced. Therefore, the present invention has a better effect of isolating EM waves than a prior art resilient sheet of connect port does.

Figure 5:
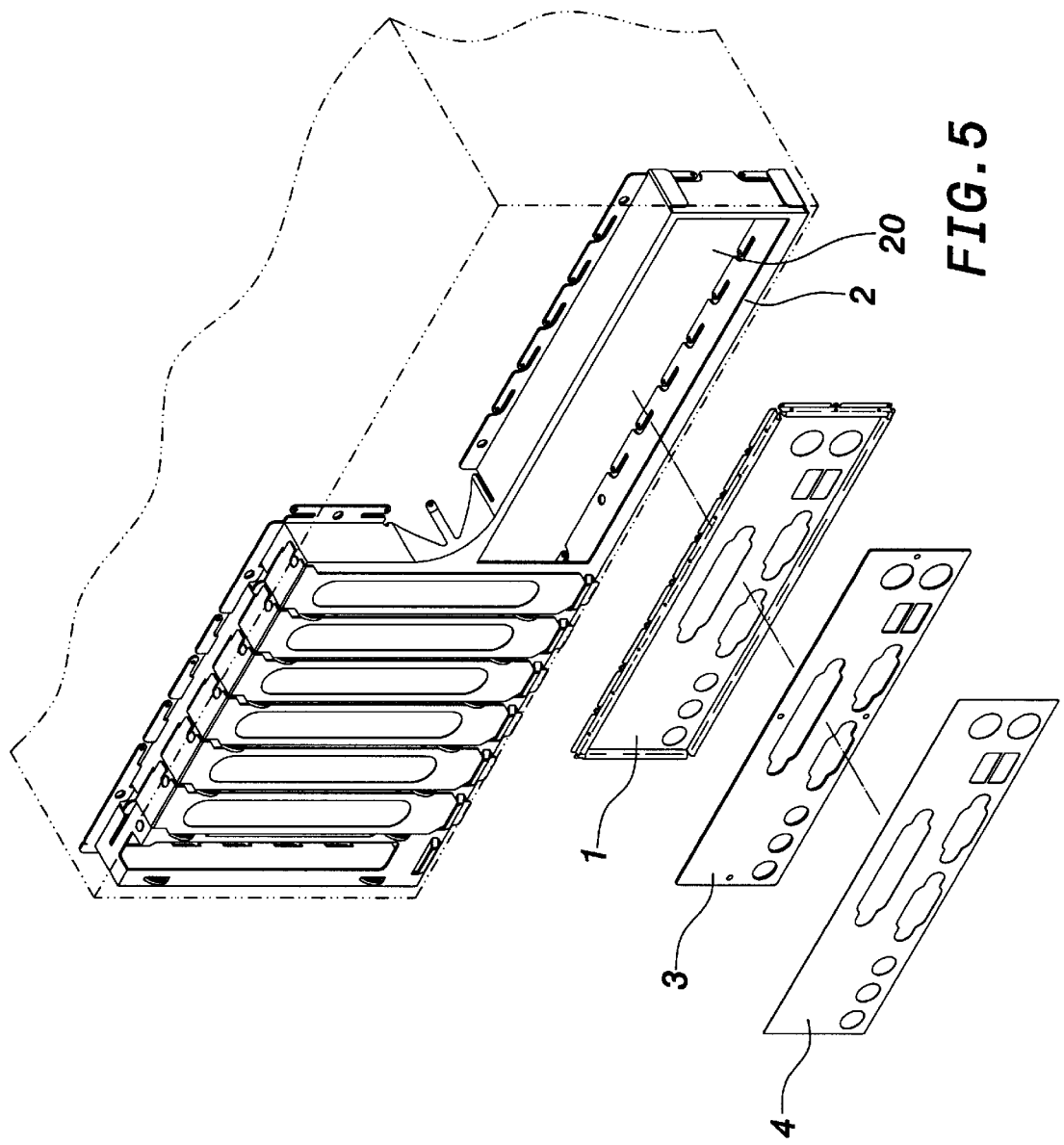
FIG. 5 is a perspective assembly view of the present invention.

Furthermore, as shown in FIG. 5, a reinforcing pad 3 can be riveted on the main body 1 of the present invention. An indication faceplate 4 can be attached on the reinforcing pad 3. Insertion holes of connector corresponding to insertion holes at the rear window 20 of the case of the computer are formed on the main body 1, the reinforcing pad 3, and the indication faceplate 4 to facilitate the recognition of positions of insertion holes for a user.

To sum up, the present invention provides a resilient sheet of connect port for isolating EM waves. More contact points of the resilient sheet of connect port with the rear plate set can be obtained so as to achieve a better effect of isolating EM waves.

Although the present invention has been described with reference to the preferred embodiments thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

I claim:

1. A resilient sheet of connect port for isolating electromagnetic waves, comprising:

a main body of rectangular sheet;

an outer frame bent toward the same direction from four edges of said main body, the cross section of said outer frame being U-shaped, a plurality of bumps equally spaced being formed on the outer side surface of said outer frame, said resilient sheet of connect port being retained on a rear window of the case of a computer through said bumps; and a plurality of resilient plates and resilient projective ears formed at the longitudinal and transverse positions along the outer edge of said outer frame, each said resilient projective ear being situated between two adjacent said resilient plates, a raised point being formed on each said resilient projective ear, said raised points contacting on said rear plate set of the case of the computer to increase the count of contact points of said resilient plates with said rear plate set so that the object of isolating electromagnetic waves can be achieved.

2. The resilient sheet of a connect port for isolating electromagnetic waves as claimed in claim 1, wherein a gap is formed between said resilient plate and said resilient projective ear.

3. The resilient sheet of a connect port for isolating electromagnetic waves as claimed in claim 1, wherein an indication faceplate is joined on said main body, and insertion holes of connector corresponding to insertion holes at the rear window of the case of the computer are formed on said indication faceplate and said main body.

* * * * *